United States Patent
Perkins et al.

(10) Patent No.: US 8,941,218 B1
(45) Date of Patent: Jan. 27, 2015

(54) PASSIVATION FOR GROUP III-V SEMICONDUCTOR DEVICES HAVING A PLATED METAL LAYER OVER AN INTERLAYER DIELECTRIC LAYER

(71) Applicant: Avago Technologies General IP (Singapore) Pte. Ltd., Singapore (SG)

(72) Inventors: Nathan Perkins, Fort Collins, CO (US); Jonathan Abrokwah, Fort Collins, CO (US); Ricky Snyder, Windsor, CO (US); Scott A. Rumery, Windsor, CO (US); Robert G. Long, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/965,567

(22) Filed: Aug. 13, 2013

(51) Int. Cl.
*H01L 23/58* (2006.01)
*H01L 23/00* (2006.01)
*H01L 21/02* (2006.01)

(52) U.S. Cl.
CPC ........ *H01L 23/564* (2013.01); *H01L 21/02241* (2013.01)
USPC ..................... 257/635; 257/790; 257/E23.134

(58) Field of Classification Search
CPC ................. H01L 21/76832; H01L 21/76834
USPC .......... 257/615, 635, 639, 640, 790, E23.116, 257/E23.134; 438/106, 958
See application file for complete search history.

(56) References Cited

U.S. PATENT DOCUMENTS

| | | | | |
|---|---|---|---|---|
| 5,750,419 A | * | 5/1998 | Zafar | ................................. 438/3 |
| 6,255,671 B1 | | 7/2001 | Bojarczuk, Jr. et al. | |
| 6,563,188 B2 | | 5/2003 | Nagatani | |

OTHER PUBLICATIONS

Philipp Laube, "Metallization", Aug. 31, 2012.

* cited by examiner

*Primary Examiner* — Tucker Wright (57) ABSTRACT

A semiconductor device that includes a Group III-V semiconductor substrate, circuit elements in and on the substrate, a first metal layer over the substrate, and an interlayer dielectric (ILD) layer. The ILD layer defines a via that extends through it to the first metal layer. Over the ILD layer is thick second metal layer and a passivation layer. The second metal layer includes an interconnect that extends through the via into contact with the first metal layer. The second metal layer is patterned to define at least one conductor. The passivation layer covers the second metal layer and the interlayer dielectric layer, and includes stacked regions of dielectric material. Ones of the regions under tensile stress alternate with ones of the regions under compressive stress, such that the passivation layer is subject to net compressive stress.

19 Claims, 11 Drawing Sheets

PASSIVATION FOR GROUP III-V SEMICONDUCTOR DEVICES HAVING A PLATED METAL LAYER OVER AN INTERLAYER DIELECTRIC LAYER

BACKGROUND

RF devices constructed from Group III-V semiconductor materials, such as GaAs or GaAs alloys, are commonly employed in wireless communication systems. Such RF devices may include RF power amplifiers, low noise amplifiers, switches, and other similar integrated circuits. Optimum performance makes it desirable that the resistance of the conductors that connect the circuit elements of the RF devices to bonding pads be as low as possible. This property commonly indicates the use of a thick layer of gold (Au), typically deposited by a plating process, as the material of the conductors. The combination of relatively challenging base device transistor vertical dimensions plus relatively small lateral dimensions leads to manufacturing challenges. Such challenges can be mitigated by the use of a process architecture in which the gold conductors are located on the substantially planar surface of an interlayer dielectric (ILD) layer, and vias extending through the ILD layer provide connections between the gold conductors and one or more layers of metallization of the underlying circuitry. In an example, the material of the ILD layer is bisbenzocyclobutene (BCB). The ILD layer and the conductors are then covered by a thick passivation layer. This approach undesirably creates large stress mismatches between the ILD layer, the gold conductors, and the passivation layer. Stress mismatches can compromise the hermeticity of the passivation, which can impair the reliability of the semiconductor device when the device is exposed to moisture.

Figure 1:
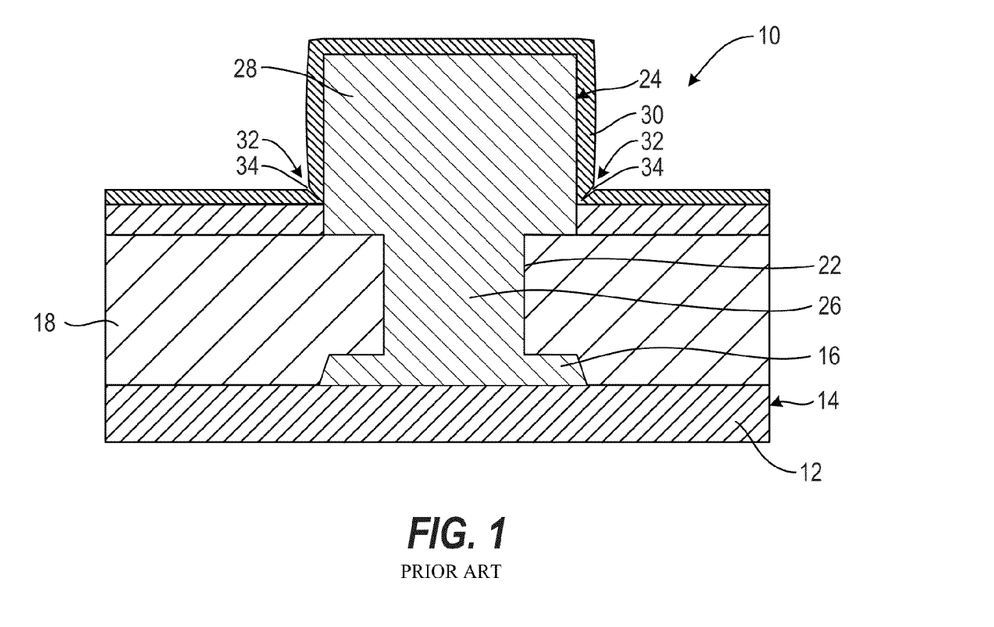
FIG. 1 is a cross-sectional view showing a portion of an example of a conventional Group III-V semiconductor device having a thick, plated-gold conductor on the surface of an interlayer dielectric layer.

FIG. 1 is a cross-sectional view showing a portion of an example 10 of a conventional Group III-V semiconductor device having a thick, plated-gold conductor on the surface of an interlayer dielectric layer. Device 10 includes a substrate 12 of gallium arsenide (GaAs) or a GaAs alloy. Circuit elements 14 (not individually shown) are located in and on substrate 12. A first metal layer 16 covers substrate 12 and is patterned to define conductors (not individually shown) that selectively interconnect the circuit elements. The material of first metal layer 16 is typically gold (Au). In some implementations, first metal layer 16 additionally includes clad layers of such metals as titanium (Ti) or platinum (Pt) on one or both of its surface facing substrate 12 and its surface remote from substrate 12. An interlayer dielectric (ILD) layer 18 covers the circuit elements and first metal layer 16 to provide a fully or partially planarized surface. Typical materials of ILD layer 18 include BCB, polyimide, and polybenzoxazole (PBO).

A via 22 extends through ILD layer 18. A second metal layer 24 covers ILD layer 118. Second metal layer 24 includes an interconnect 26 that extends through via 22 to first metal layer 16. Second metal layer 24 is additionally patterned to define conductors that extend across the surface of ILD layer 18. The material of second metal layer 24 is typically gold deposited by a plating process. A thick passivation layer 30 of dielectric material covers second metal layer 24 and the portions of ILD layer 18 exposed by the patterning of the second metal layer. Semiconductor device 10 includes passivation layer 30 to improve its resistance to moisture.

Figure 2:
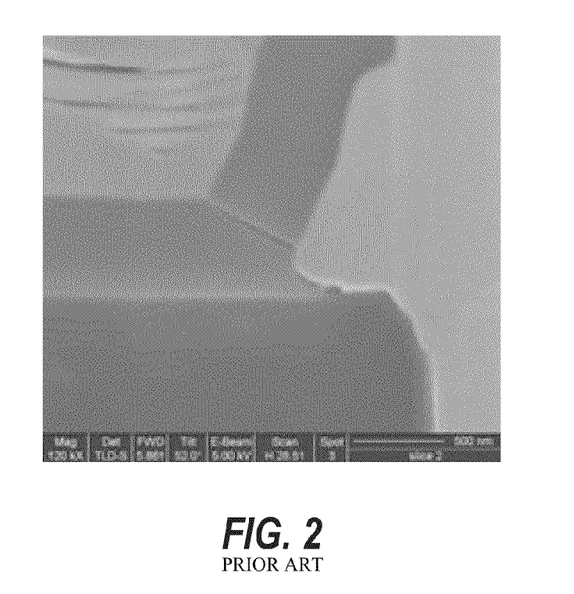
FIG. 2 is a scanning electron microscope image showing a portion of an example of the conventional semiconductor device shown in FIG. 1 exhibiting cracks in its passivation layer.

In a conventional semiconductor device having the structure just described, cracks 34 can form in passivation layer 30 at the corners 32 where the passivation layer follows the contour changes resulting from the presence of conductors 28 of the surface of ILD 18. Cracks 34 result in a loss of hermeticity that undesirably degrades the moisture reliability of the semiconductor device. FIG. 2 is a scanning electron microscope image showing a portion of an example of conventional semiconductor device 10. The image clearly shows a crack in the passivation layer at the corner between the ILD layer and the side of the conductor defined in the second metal layer.

Accordingly, what is needed is an architecture that allows a Group III-V semiconductor device to use thick plated gold conductors to without compromising the hermeticity of the passivation layer.

DETAILED DESCRIPTION

The inventors have identified two main factors that cause cracks to form in the passivation layer of the conventional device described above with reference to FIG. 1. First, the large difference among the coefficients of thermal expansion between the materials of second metal layer 24, passivation layer 30, and interlayer dielectric (ILD) layer 18 leads to large stresses in the material of the passivation layer as the passivation layer is deposited. These stresses are particularly severe at the corners 32 where the passivation layer follows the contour change resulting from the presence of conductor 28 of the surface of ILD layer 18. Second, the relatively poor geometry of the corners 32 and a tendency for a physical deposition seam to form in the passivation layer at the corners weaken the mechanical integrity of the passivation layer. These factors increase the likelihood that cracks will form at the corners and impair the reliability of the semiconductor device when the device is exposed to moisture.

The physical origin of the stress formation in the passivation layer is a difference in coefficient of thermal expansion between second metal layer 24 and passivation layer 30. Deposition of second metal layer 24 subjects the second metal layer to an initial stress. However, the initial stress of the second metal layer is relatively unimportant, because the second metal layer rapidly self-anneals when the passivation layer is deposited at an elevated temperature. After the dielectric material of passivation layer 30 is deposited, the device is heated to an elevated temperature to anneal the passivation layer. The device cooling after the annealing process subjects second metal layer 24 to tensile strain proportional to the product of the coefficient of thermal expansion of the material of the second metal layer and the difference between the annealing temperature and room temperature. Typically, the tensile stress to which second metal layer 24 is subject is in a range from 100 to 240 MPa. Development of tensile stress in second metal layer 24 is inherent, because passivation layer 30 must be annealed at an elevated temperature. Lower anneal temperatures result in less initial stress. However, reducing the anneal temperature too low results in opposite stress problems later during the thermal cycles that occur during die attach.

Disclosed herein is a semiconductor device that includes a Group III-V semiconductor substrate, circuit elements fabricated in and on the substrate, a first metal layer over the substrate, the first metal layer patterned to selectively interconnect the circuit elements, and a planarizing interlayer dielectric layer over the first metal layer and the circuit elements. The interlayer dielectric layer defines a via that extends through the interlayer dielectric layer to the first metal layer. The semiconductor device additionally includes a second metal layer over the interlayer dielectric layer, and a passivation layer. The second metal layer is greater in thickness than the first metal layer, and includes an interconnect that extends through the via into contact with the first metal layer. The second metal layer is patterned to define at least one conductor. The passivation layer covers the second metal layer and the interlayer dielectric layer, and includes stacked regions of dielectric material. Ones of the regions under tensile stress alternate with ones of the regions under compressive stress, such that the passivation layer is subject to net compressive stress.

Also disclosed herein is a semiconductor device that includes a Group III-V semiconductor substrate, circuit elements fabricated in and on the substrate, a first metal layer over the substrate, the first metal layer patterned to selectively interconnect the circuit elements, a planarizing interlayer dielectric layer over the first metal layer and the circuit elements, and a first passivation layer over the interlayer dielectric layer. The first passivation layer and the interlayer dielectric layer define a via that extends through them to the first metal layer. The semiconductor device additionally includes a second metal layer over the interlayer dielectric layer, and a second passivation layer. The second metal layer is greater in thickness than the first metal layer, and includes an interconnect that extends through the via into contact with the first metal layer. The second metal layer is patterned to define at least one conductor. The second passivation layer covers the second metal layer and the first passivation layer, and includes stacked thin regions of dielectric material. Ones of the regions under tensile stress alternate with ones of the regions under compressive stress, such that the second passivation layer is subject to net compressive stress.

Also disclosed herein is a method of making a semiconductor device. In the method, a Group III-V semiconductor substrate, circuit elements in and on the substrate, a first metal layer over the substrate, the first metal layer patterned to define conductors that selectively interconnect the circuit elements, and a planarizing interlayer dielectric layer over the first metal layer and the circuit elements are provided. A via is formed extending through the interlayer dielectric layer to the first metal layer. A second metal layer, greater in thickness than the first metal layer, is deposited over the interlayer dielectric layer to form an interconnect extending through the via into contact with the first metal layer. The second metal layer is patterned to define at least one conductor. Stacked regions of dielectric material are deposited over the second metal layer and the interlayer dielectric layer to form a passivation layer subject to net compressive stress. As the dielectric material of the passivation layer is deposited deposition conditions are alternately changed to subject alternate ones of the regions to tensile stress and compressive stress, respectively.

In an embodiment of the above-describe method, the passivation layer is a second passivation layer, and the method additionally includes depositing a first passivation layer on the interlayer dielectric layer. Forming the via includes forming the via additionally extending through the first passivation layer. Depositing the second metal layer includes depositing the second metal layer on the first passivation layer, and depositing stacked regions includes depositing the stacked regions over the second metal layer and the first passivation layer.

Figure 3A:
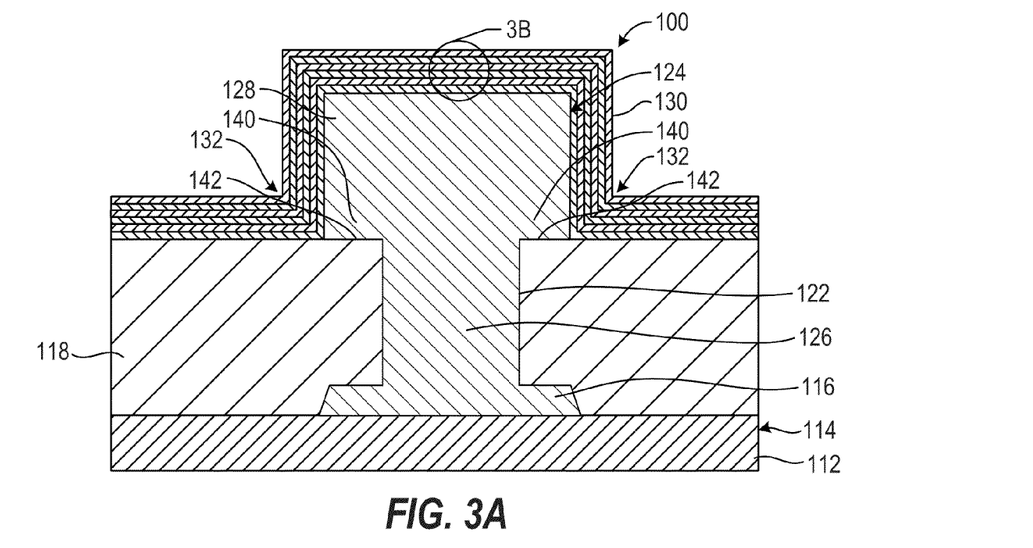
FIG. 3A is a cross-sectional view showing a small portion of an example of a Group III-V semiconductor device having a thick, plated-gold second metal layer and a passivation layer having stacked regions of alternating stress.

FIG. 3A is a cross-sectional view showing a small portion of an example 100 of a Group III-V semiconductor device having a thick, plated-gold second metal layer on the surface of an interlayer dielectric layer, and a passivation layer having stacked regions of dielectric material in which regions under tensile stress alternate with regions under compressive stress to subject the passivation layer to overall compressive stress.

Semiconductor device 100 includes a substrate 112. Typical materials of substrate 112 include gallium arsenide (GaAs), a GaAs alloy, or another Group III-V semiconductor. Circuit elements 114 (not individually shown), such as field effect transistors (HEMTs, pHEMTs, MESFETs, JFETs), heterojunction bipolar transistors (HBTs), combinations thereof (BiFETs), and integrated passive devices, such as resistors, capacitors, inductors, ESD diodes, etc., are located in and on substrate 112. A first metal layer 116 covers circuit elements 114 and is patterned to define conductors (not individually shown) that selectively interconnect the circuit elements. The material of first metal layer 116 is typically gold (Au). In some implementations, first metal layer 116 additionally includes clad layers of such metals as titanium (Ti) or platinum (Pt) on one or both of its surface facing substrate 112 and its surface remote from substrate 112. In some implementations, semiconductor device 100 has more than one first metal layer.

An interlayer dielectric (ILD) layer 118 covers circuit elements 114 and first metal layer 116 to provide a fully or partially planarized surface. ILD layer 118 is a layer of a polymer. Typical materials of ILD layer 118 include bisbenzocyclobutene (BCB), polyimide, and polybenzoxazole (PBO).

A via 122 extends through ILD layer 118. Via 122 is representative of a number of vias (not shown) that extend through ILD layer 118 to various points on first metal layer 116. A second metal layer 124 covers ILD layer 118. Second metal layer 124 includes an interconnect 126 that extends through via 122 to first metal layer 116. Interconnect 126 is representative of a number of interconnects (not shown) that extend through respective vias (not shown) defined in ILD layer 118 to connect various points on the second metal layer to corresponding points on first metal layer 116. Second metal layer 124 is additionally patterned to define conductors that extend laterally across the surface of ILD layer 118. An exemplary conductor is shown at 128. Reference numeral 128 will additionally be used to refer to the conductors individually or collectively.

Second metal layer 124 typically includes a thin, patterned seed layer (shown at 180 in FIG. 9E) in contact with ILD layer 118, and a thick layer of gold deposited on the seed layer by an electro-plating or an electro-less plating process. Second metal layer 124 is thicker than first metal layer 116. In an example, the thickness of second metal layer 124 is greater than 1.5 µm, and is at least 1.3 times that of first metal layer 116.

Second metal layer 124 includes an annular portion 140 around the opening of via 122. Annular portion 140 extends laterally over ILD layer 118 by a distance typically greater than 150 nm. In an example, the thickness of second metal layer 124 is greater than 1.5 µm, and is typically 2 to 5 µm. Annular portion 140 has an enclosure of at least 100 nm and as much as 500 nm around via 122. Annular portion 140 contacts ILD layer 118 around the opening of via 122 to form a seal 142 that encloses the via. In the event that the hermeticity of passivation layer 130 (described below) is compromised, seal 142 provides an additional barrier that prevents external contaminants from traveling through the via to first metal layer 116 and circuit elements 114.

A passivation layer 130 covers second metal layer 124 and the portions of ILD layer 118 exposed by the patterning of the second metal layer. Passivation layer 130 is a layer of plasma-deposited dielectric material. In an example, the material of passivation layer 130 is $Si_3N_4$. Other materials that may be used include silicon dioxide ($SiO_2$) and silicon oxynitride ($SiO_xN_y$) may also be used. The overall thickness of passivation layer 130 is typically in a range from 0.5-3.0 µm.

Figure 3B:
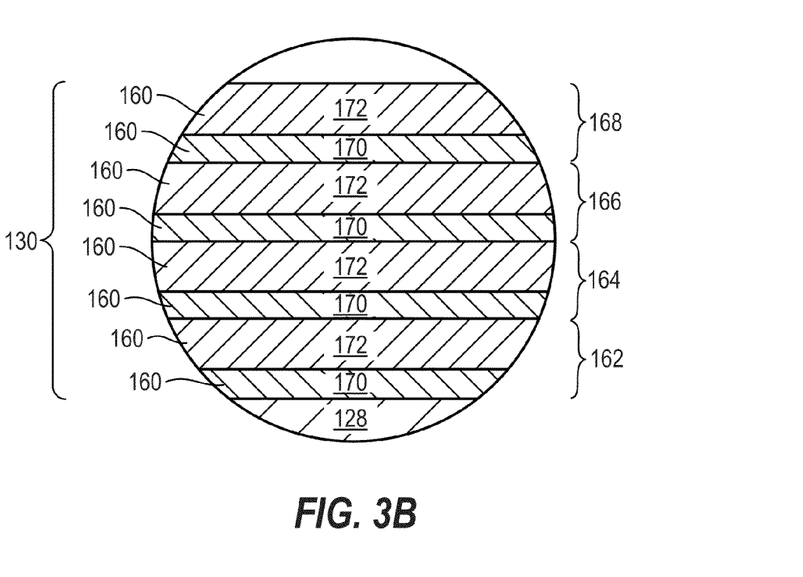
FIG. 3B is an enlarged cross-sectional view showing the structure of the passivation layer of the semiconductor device shown in FIG. 3A.

FIG. 3B is an enlarged cross-sectional view showing the structure of passivation layer 130. Passivation layer 130 is composed of stacked regions 160 of dielectric material. Two adjacent regions 160 will be said to constitute a region pair. The example of passivation layer 130 shown has four region pairs 162, 164, 166, 168. Other examples of passivation layer 130 have more or fewer region pairs than the number shown in FIG. 3B, although fewer region pairs can increase the risk of decreased hermeticity. Region pairs 162, 164, 166, 168 are stacked so that region pair 162 contacts ILD layer 118 and second metal layer 124, region pair 164 covers region pair 162, region pair 166 covers region pair 164, and region pair 168 covers region pair 166. Each of the region pairs 162, 164, 166, 168 is composed of a respective region 170, closer to substrate 112, and a respective region 172, further from substrate 112, stacked on region 170. The structure shown in FIG. 3B extends across the entire width of passivation layer 130, including the portions of the passivation layer that cover the sides of conductor 128 that extend substantially orthogonally to substrate 112.

In the example shown, in each region pair 162, 164, 166, 168, the dielectric material of region 170 closer to substrate 112 is subject to tensile stress, and the dielectric material of region 172, further from substrate 112, is subject to compressive stress greater than the tensile stress to which region 170 is subject. To distinguish the regions 170, 172 constituting each region pair 162, 164, 166, 168, region 170 will be referred to herein as a tensile region 170, and region 172 will be referred to herein as a compressive region 172. In another example, in each region pair, compressive region 172 is closer to substrate 112 than tensile region 170. Additionally, in each region pair 162, 164, 166, 168, the thickness of the respective tensile region 170 is less than that of the respective compressive region 172. Depending on the respective magnitude of the tensile stress in each tensile region 170, the respective magnitude of the compressive stress in each compressive region 172, the number of region pairs, and the relative thicknesses of the tensile region 170 and the compressive region 172, passivation layer 130 is subject to an overall compressive stress of a magnitude similar to that which compensates for the tensile stress to which conductor 128 is subject. The overall compressive stress to which passivation layer 130 is subject compensates for the tensile stress to which conductor 128 is subject. In an example, the overall compressive stress to which passivation layer 130 is subject is greater than −150 megapascals (MPa), as the passivation layer is deposited.

Figure 4:
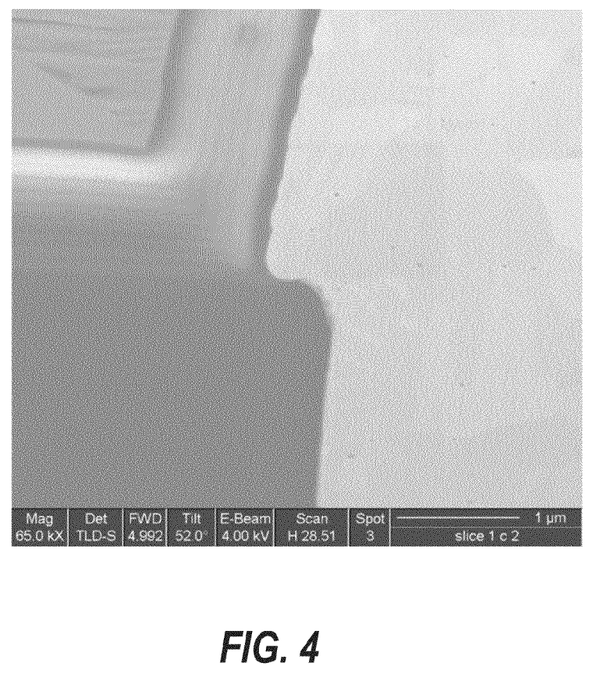
FIG. 4 is a scanning electron microscope image showing a portion of an example of the semiconductor device shown in FIG. 3A.

FIG. 4 is a scanning electron microscope image showing a portion of an example of semiconductor device 100 that includes the corner 132 between ILD layer 118 and the side of conductor 128. The SEM image shows this region to be free of cracks. Additionally, the SEM image shows the alternating multilayer structure of passivation layer 130.

Passivation layer 130 composed of stacked regions of dielectric material in which compressive regions subject to compressive stress alternate with tensile regions subject to tensile stress significantly reduces the likelihood of device failure due to a loss of hermeticity caused by cracks forming in the passivation layer. The stacked regions allow point defects that may be present in any individual region to be encapsulated by the dielectric material of one or more of the subsequently-deposited regions. This makes the passivation layer as a whole less susceptible to pinhole-type defects. Additionally, compared to a conventional homogeneous passivation layer with a similar overall thickness, passivation layer 130 composed of stacked regions of dielectric material in which compressive regions alternate with tensile regions produces superior coverage in the corners 132 between ILD layer 118 and the sides of conductor 128, and substantially reduces the formation of a deposition seam at corners 132. Reducing or eliminating the above-described deposition seam at corners 132 leads to a significant increase in the mechanical strength of passivation layer 130.

Figure 5A:
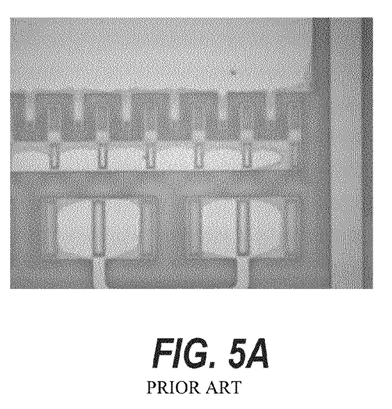
FIGS. 5A and 5B are photomicrographs showing a portion of a conventional semiconductor device and a portion of a semiconductor device similar to that shown in FIG. 3A, respectively, after immersion in a potassium iodide-iodine ($KI-I_2$) solution.
Figure 5B:
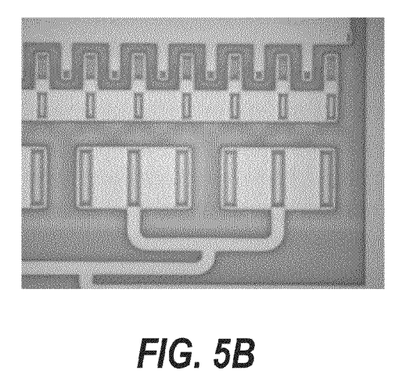

FIG. 5A is a photomicrograph showing a portion of an example of conventional semiconductor device 10 using conventional, homogeneous passivation layer 30 after the semiconductor device was immersed in a potassium iodide-iodine ($KI-I_2$) solution for 60 minutes. The $KI-I_2$ solution is an etchant for gold. The photomicrograph clearly shows the effects of penetration of the etch solution due to a lack of hermeticity. FIG. 5B is a photomicrograph showing a portion of an example of semiconductor device 100 as disclosed herein and having a multi-region passivation layer 130 after the semiconductor device was immersed in the $KI-I_2$ solution for 60 minutes. The photomicrograph shows no evidence of the effects of penetration of the etch solution, indicating that multi-region passivation layer 130 provides substantially better hermeticity than a conventional, homogeneous passivation layer.

Figure 6A:
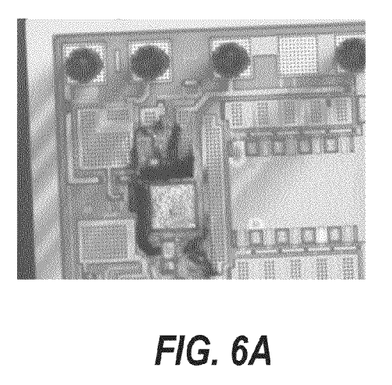
FIGS. 6A and 6B are photomicrographs showing a portion of a conventional semiconductor device and a portion of a semiconductor device similar to that shown in FIG. 3A, respectively, after a 1000-hour THBL stress test.
Figure 6B:
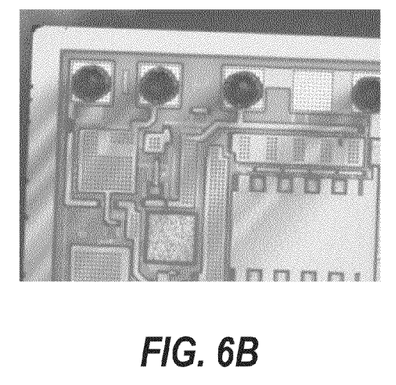

The improvement in hermeticity illustrated in FIGS. 5A and 5B translates to a substantial improvement in reliability for fully-processed electrical devices. FIGS. 6A and 6B show the effects of subjecting fully processed electrical devices to temperature/humidity bias life (THBL) environmental stress. FIG. 6A shows an example of a semiconductor device having a conventional passivation layer, such as that described above with reference to FIG. 1. FIG. 6B shows an example of a semiconductor device is similar to semiconductor device 100 described above with reference to FIGS. 3A and 3B. At as little as several hundred hours of THBL stress, the conventional semiconductor device shown in FIG. 6A shows show gross moisture penetration, dielectric delamination, and gross short formation. The semiconductor device shown in FIG. 6B shows substantially no evidence of THBL degradation with stress times of up to 1000 hrs.

In semiconductor device 100 described above with reference to FIGS. 3A and 3B, the adhesion of second metal layer 124 (and especially that of conductor 128) to ILD layer 118 depends on the consistency of the surface of ILD layer 118 on which the second metal layer is deposited. During the anisotropic etch process used to form via 120 in ILD layer 118, the surface of the ILD layer becomes exposed to the etchant, which disrupts the surface of the ILD layer. The disruption of the surface of the ILD layer results in sub-optimal adhesion of second metal layer 124.

Figure 7:
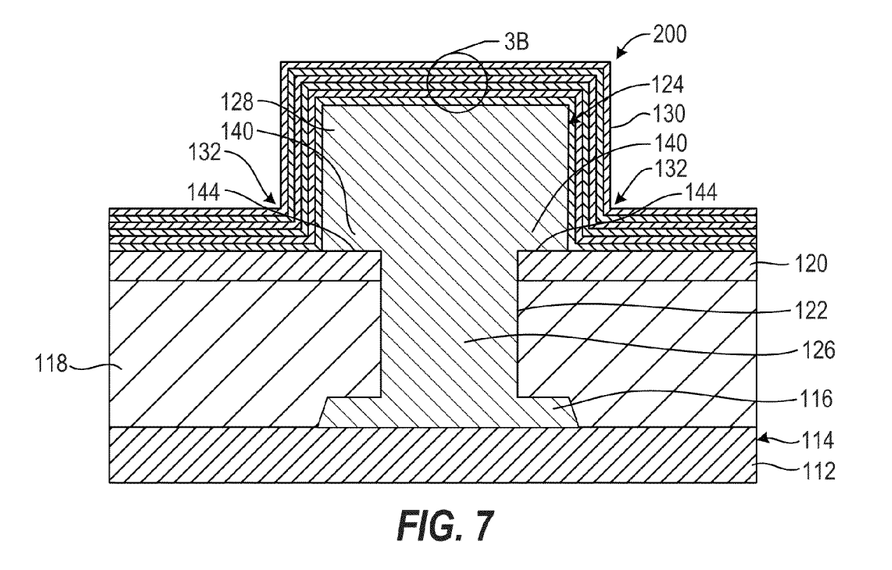
FIG. 7 is a cross-sectional view showing a small portion of an example of a Group III-V semiconductor device having a thick, plated-gold second metal layer, a first passivation layer, and a second passivation layer having stacked regions of alternating stress.

FIG. 7 is a cross-sectional view showing a small portion of an example 200 of a Group III-V semiconductor device having a thick, plated-gold second metal layer, a first passivation layer between the ILD layer and the second metal layer, and a second passivation layer having stacked regions of dielectric material in which regions under tensile stress alternate with regions under compressive stress to subject the second passivation layer to overall compressive stress. The second metal layer adheres more reliably to the first passivation layer than to the interlayer dielectric layer. Elements of semiconductor device 200 that correspond to elements of semiconductor device 100 described above with reference to FIGS. 3A and 3B are indicated using the same reference numerals, and will not be described again in detail.

Semiconductor device 200 includes substrate 112 of gallium arsenide (GaAs), a GaAs alloy, or another Group III-V semiconductor. Circuit elements 114 (not individually shown), such as field effect transistors (HEMTs, pHEMTs, MESFETs), heterojunction bipolar transistors (HBTs), combinations thereof (BiFETs), and integrated passive devices, such as resistors, capacitors, inductors, ESD diodes, etc., are located in and on substrate 112. A first metal layer 116 covers circuit elements 114 and is patterned to define conductors (not individually shown) that selectively interconnect the circuit elements. The material of the first metal layer 116 is typically gold (Au). In some implementations, first metal layer 116 additionally includes clad layers of such metals as titanium (Ti) or platinum (Pt) on one or both of its surface facing substrate 112 and its surface remote from substrate 112. In some implementations, semiconductor device 200 has more than one first metal layer.

Interlayer dielectric (ILD) layer 118 covers circuit elements 114 and first metal layer 116 to provide a fully or partially planarized surface. ILD layer 118 is a layer of a polymer. Typical materials of ILD layer 118 include bisbenzocyclobutene (BCB), polyimide, and polybenzoxazole (PBO).

A first passivation layer 120 covers ILD layer 118. First passivation layer 120 is a layer of a dielectric material. In an example, the material of first passivation layer 120 is silicon nitride ($Si_3N_4$). Other materials that may be used include silica dioxide ($SiO_2$) and silicon oxynitride ($SiO_xN_y$). The overall thickness of first passivation layer 120 is typically greater than 0.1 μm in the finished device, and is substantially greater than 0.1 μm when the first passivation layer is initially deposited.

Via 122 extends through first passivation layer 120 and ILD layer 118. Via 122 (?) is representative of a number of vias (not shown) that extend through ILD layer 118 to various points on first metal layer 116. Second metal layer 124 covers first passivation layer 120. Second metal layer 124 includes an interconnect 126 that extends through via 122 to first metal layer 116. Interconnect 126 is representative of a number of interconnects (not shown) that extend through respective vias (not shown) defined in first passivation layer 120 and ILD layer 118 to connect various points on the second metal layer to corresponding points on first metal layer 116. Second metal layer 124 is additionally patterned to define conductors that extend laterally across the surface of first passivation layer 120. An exemplary conductor is shown at 128, and reference numeral 128 will additionally be used to refer to the conductors individually or collectively.

Second metal layer 124 typically includes a thin, patterned seed layer (shown at 180 in FIG. 9E) on first passivation layer 120, and a thick layer of gold deposited on the seed layer by an electro-plating or an electro-less plating process. Second metal layer 124 is thicker than first metal layer 116. In an example, the thickness of second metal layer 124 is greater than 1.5 μm, and is at least 1.3 times that of first metal layer 116. In an example, the thickness of the second metal layer 124 is greater than 1.5 μm, and is typically between 2 to 5 μm.

Where conductor 128 and interconnect 126 intersect, conductor 128 includes an annular portion 140 around the opening of via 122. Annular portion 140 extends laterally over first passivation layer 120 by a distance typically greater than 100-500 nm. Annular portion 140 contacts first passivation layer 120 around the opening of via 122 forms a seal 144 that encloses the via. In the event that the hermeticity of passivation layer 130 is compromised, seal 144 provides an additional barrier that prevents moisture from traveling through the via to first metal layer 116 and circuit elements 114. Because of the adhesion of second metal layer 124 to first passivation layer 120 is greater than that of second metal layer 124 to ILD layer 118, seal 144 formed by second metal layer 124 contacting first passivation layer 120 is more reliable and durable than seal 142 in semiconductor device 100 described above with reference to FIG. 3A. Seal 142 is formed by second metal layer 124 contacting ILD layer 118. Moreover, in semiconductor device 200, adhesion between conductor 128 and first passivation layer 120 is greater than that between conductor 128 and ILD layer 118 in semiconductor device 100 described above with reference to FIG. 3A.

In semiconductor device 200, passivation layer 130 is referred to as a second passivation layer 130 to distinguish multi-region passivation layer 130 from first passivation layer 120. Second passivation layer 130 covers second metal layer 124 and the portions of first passivation layer 120 exposed by the patterning of the second metal layer. Second passivation layer 130 is a layer of dielectric material. In an example, the material of second passivation layer 130 is silicon nitride ($Si_3N_4$). Other materials that may be used include silicon dioxide ($SiO_2$) and silicon oxynitride ($SiO_xN_y$). The overall thickness of second passivation layer 130 is typically in a range from 0.5-3.0 μm. Second passivation layer 130 includes stacked regions of dielectric material in which regions under tensile stress alternate with regions under compressive stress to subject the second passivation layer to overall compressive stress. The structure of second passivation layer 130 is described in more detail above with reference to FIG. 3B.

In semiconductor device 200, second passivation layer 130 bonds to first passivation layer 120 more effectively than passivation layer 130 bonds to ILD layer 118 in semiconductor device 100 described above with reference to FIG. 3A.

Figure 8:
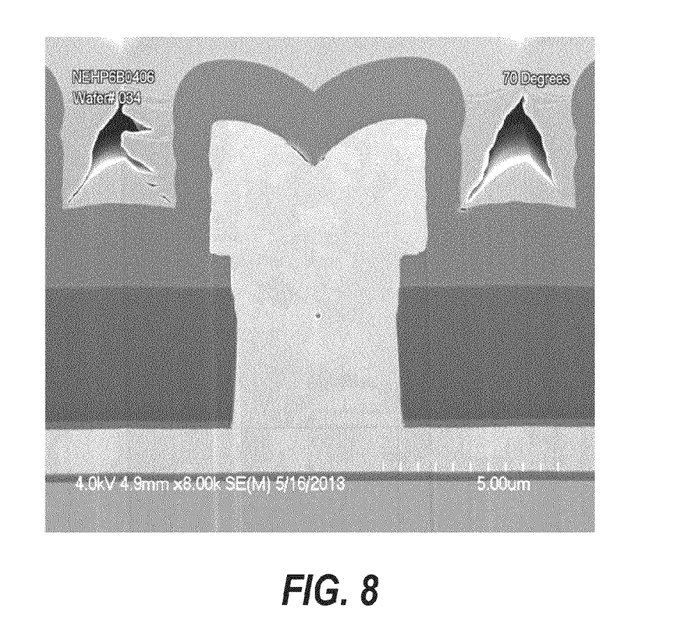
FIG. 8 is a scanning electron microscope image showing a portion of an example of the semiconductor device shown in FIG. 7.

FIG. 8 is a scanning electron microscope image showing a portion of an example of semiconductor device 200. The SEM image shows an absence of cracks notwithstanding the shop contour changes resulting from the presence of conductor 128 on the surface of second passivation layer 120. Additionally, the SEM image shows the alternating multilayer structure of second passivation layer 130.

Tested samples of a semiconductor device similar to semiconductor device 200 exhibited a resistance similar to that of semiconductor device 100 to immersion for 60 minutes in a KI-I$_2$ solution, as described above with reference to FIGS. 5A and 5B, and to a 1000-hour THBL stress test, as described above with reference to FIGS. 6A and 6B. Moreover, samples of semiconductor device 200 exposed for 96 hours in an autoclave to a temperature of 121° C. and 100% relative humidity exhibited no failures, whereas samples of semiconductor device 10 having a conventional homogeneous passivation layer, as described above with reference to FIG. 1, exhibited a 100% failure rate under the same high temperature, high humidity conditions.

A process that can be used to fabricate semiconductor device 200 will now be described with reference to the cross-sectional views shown in FIGS. 9A-9J.

Figure 9A:
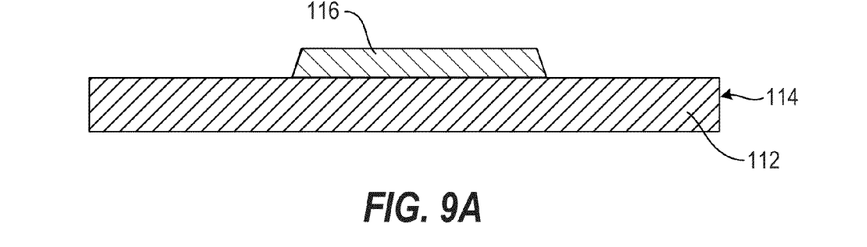
FIGS. 9A-9J are cross-sectional views showing an example of the fabrication the semiconductor device shown in FIG. 7.

FIG. 9A shows a portion of a wafer of which the substrate 112 of semiconductor device 200 constitutes part. The process to be described fabricates many instances of semiconductor device 200 on the wafer. At the end of the process, the wafer is singulated into individual semiconductor devices 200. Circuit elements 114 (not individually shown) are fabricated in and on the substrate 112. Examples of circuit elements 114 include field effect transistors (HEMTs, pHEMTs, MESFETs, JFETs), heterojunction bipolar transistors (HBTs), combinations thereof (BiFETs), and integrated passive devices, such as resistors, capacitors, inductors, ESD diodes, etc. Fabrication of circuit elements 114 is conventional and will not be described.

First metal layer 116 is deposited over circuit elements 114 and is patterned to define conductors (not individually shown) that selectively interconnect the circuit elements. The material of first metal layer 116 is typically gold (Au). In some implementations, first metal layer 116 additionally includes clad layers of such metals as titanium (Ti) or platinum (Pt) on one or both of its surface facing substrate 112 and its surface remote from substrate 112. Deposition and patterning of first metal layer 116 is conventional and will not be described.

Figure 9B:
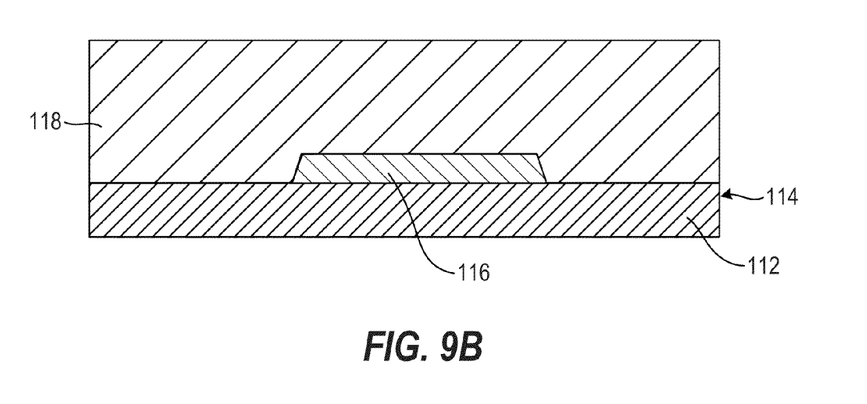

Referring to FIG. 9B, interlayer dielectric (ILD) layer 118 is spun onto the wafer of which substrate 112 constitutes part. The thickness of ILD layer 118 is sufficient to provide the ILD layer with a substantially planar surface, notwithstanding contouring of the surface of substrate 112 and first metal layer 116. Typical materials of ILD layer 118 include polymers, such as bisbenzocyclobutene (BCB), polyimide, and polybenzoxazole (PBO).

Figure 9C:
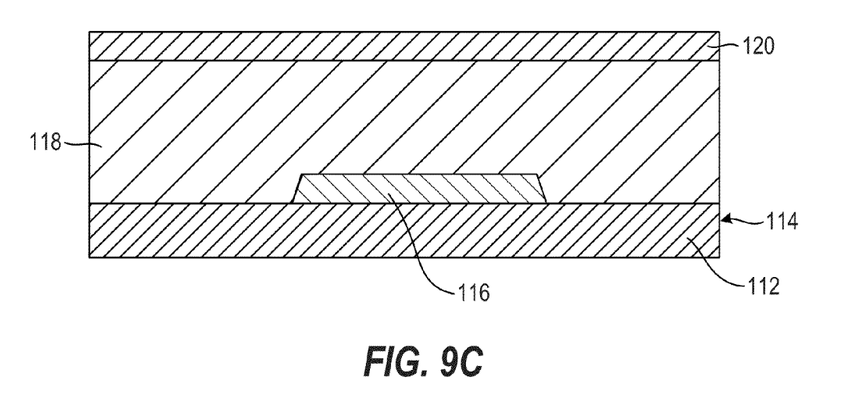

Referring to FIG. 9C first passivation layer 120 is deposited on the surface of ILD layer 118. First passivation layer 120 is a layer of plasma-deposited dielectric material deposited by plasma-enhanced chemical vapor deposition (PECVD) or another suitable process. Precursors and deposition conditions suitable for depositing first passivation layer 120 are known. Since the anisotropic etch process used to form via 122 typically reduces the thickness of first passivation layer 120, first passivation layer 120 is deposited with a thickness typically greater than thickness of the first passivation layer in the finished device. In an example, the material of first passivation layer 120 is silicon nitride ($Si_3N_4$). Other materials that may be used include silica dioxide ($SiO_2$) and silicon oxynitride ($SiO_xN_y$).

Figure 9D:
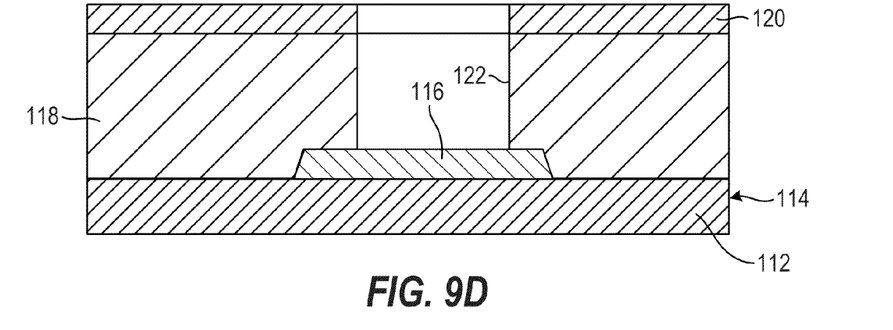

Referring to FIG. 9D, a mask (not shown) is deposited on the surface of first passivation layer 120 and is patterned to define the lateral shape and size of via 122 (and other vias in addition). The wafer of which substrate 112 constitutes part is then subject to an anisotropic etch process such as a reactive ion etching (RIE) that forms via 122 (and other vias in addition) extending through first passivation layer 120 and ILD layer 118 to first metal layer 116. As well as forming via 122, the anisotropic etch process reduces the thickness of the mask until the surface of first passivation layer 120 is exposed. The anisotropic etch process then reduces the thickness of the first passivation layer until, at the end of the anisotropic etch process, the first passivation layer reaches its design thickness. Typically, via 122 has lateral dimensions (dimensions in directions parallel to the surface of first passivation layer 120) ranging from about 1 μm to about 5 μm, and an aspect ratio (depth/lateral dimensions ratio) ranging from about 0.5 to about 4.0.

Figure 9E:
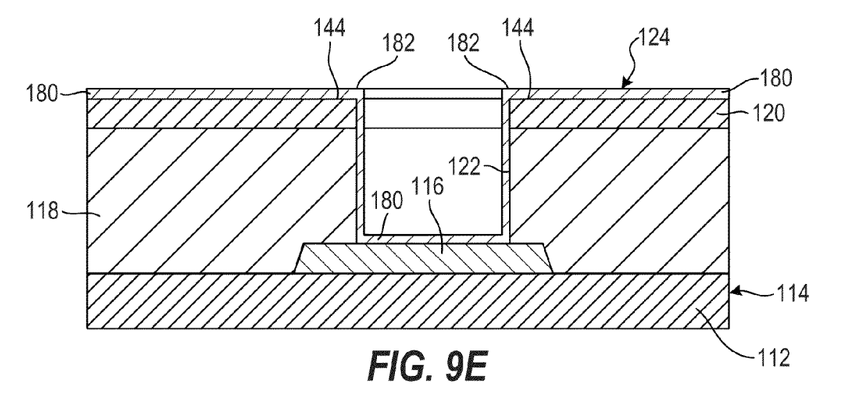
Figure 9F:
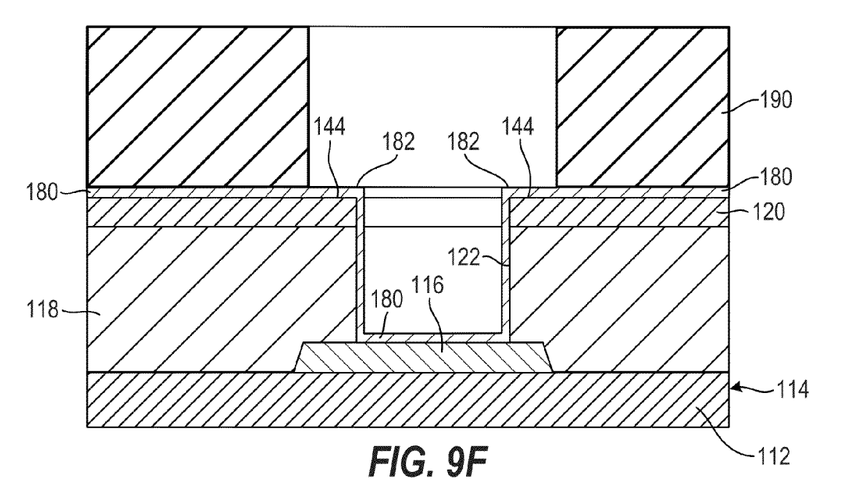
Figure 9G:
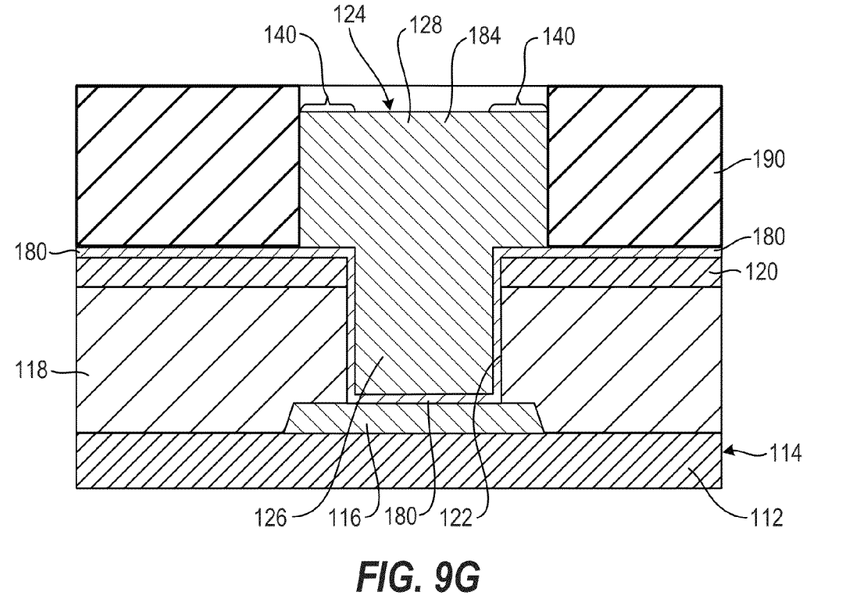

Referring next to FIG. 9E, in this example, second metal layer 124 includes a seed layer 180 and a plated layer 184 (FIG. 9G). Seed layer 180 is deposited typically by sputtering. Seed layer 180 is conformal and covers the surface of first passivation layer 120, the sides of via 122 and the portions of first metal layer 116 exposed by via 122. In an example, seed layer 180 includes a titanium-tungsten (TiW) alloy adhesion layer (not shown) covered by a gold (Au) conduction layer (not shown). In another example, the material of the adhesion layer is titanium. Seed layer 180 includes an annular portion 182 around via 122. The width of annular portion 182 is typically between 100 nm and 500 nm. Annular portion 182 contacts first passivation layer 120 to form seal 144 around the opening of via 122.

Referring to FIG. 9F, a layer of photoresist is spun on to the wafer of which substrate 112 constitutes part and is photolithographically patterned to form a mask 190 that defines the patterning of second metal layer 124 (FIG. 9G). Mask 190 is set back around via 122 to expose the annular portion 182 of seed layer 180.

Referring to FIG. 9G, the wafer of which substrate 112 constitutes part is then immersed in an electro-plating bath to deposit the plated layer 184 of second metal layer 124 on the portions of seed layer 180 exposed by mask 190. As the plating process continues, second metal layer 124 fills via 122 to form interconnect 126, and additionally forms thick conductors 128 extending across the surface of first passivation layer 120. Where conductor 128 and interconnect 126 intersect, the plated layer 184 of second metal layer 124 includes an annular portion deposited on the annular portion 182 (FIG. 9F) of seed layer 180. The annular portion of seed layer 180 and the annular portion of plated layer 184 collectively constitute the annular portion 140 of second metal layer 124. Annular portion 140 has lateral dimensions that exceed those of via 122 such that annular portion 140 extends laterally over first passivation layer 120 by a distance typically greater than 100 nm. The material of the plated layer 184 of second metal layer 124 is typically gold, and the second metal layer typically has an overall thickness greater than 1.5 μm.

Figure 9H:
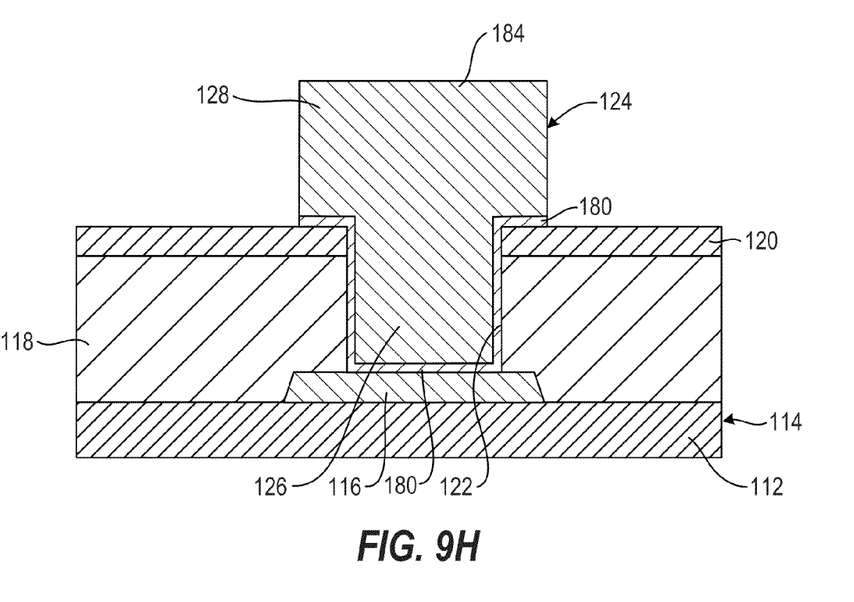

Referring to FIG. 9H, once plated layer 184 reaches its design thickness, mask 190 (FIG. 9G) is stripped from the surface of the wafer of which substrate 112 constitutes part, and the wafer is then subject to an etch that removes the portions of seed layer 180 not covered by plated layer 184. The etch process electrically isolates from each other the conductors 128 defined by the patterning of second metal layer 124. Plated layer 184 and the portions of seed layer 180 remaining under the plated layer collectively constitute second metal layer 124.

Figure 9I:
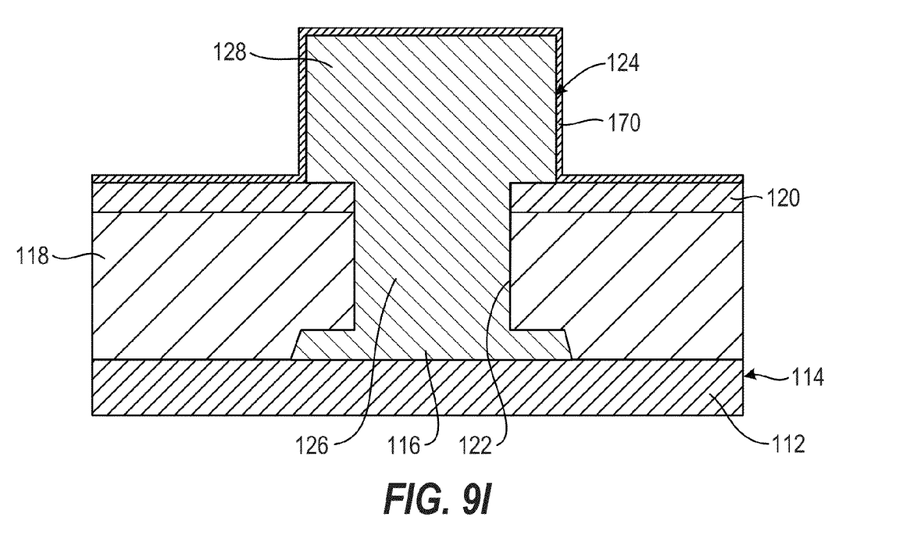

Referring to FIG. 9I, second passivation layer 130 is next deposited on second metal layer 124 and the portions of first passivation layer 120 exposed by the patterning of the second metal layer. In an example, the material of second passivation layer 130 is silicon nitride ($Si_3N_4$). Other suitable materials include silicon dioxide ($SiO_2$) and silicon oxynitride ($SiO_xN_y$). The wafer of which substrate 112 constitutes part is placed in a PECVD deposition chamber (not shown). Initial deposition conditions are established within the deposition chamber that will cause the dielectric material of the second passivation layer 130 to be deposited subject to tensile stress. Precursors suitable for forming the plasma-deposited dielectric material of second passivation layer 130 of are fed into the deposition chamber. The dielectric material deposited on first passivation layer 120 and second metal layer 124 under the initial deposition conditions forms tensile region 170.

Figure 9J:
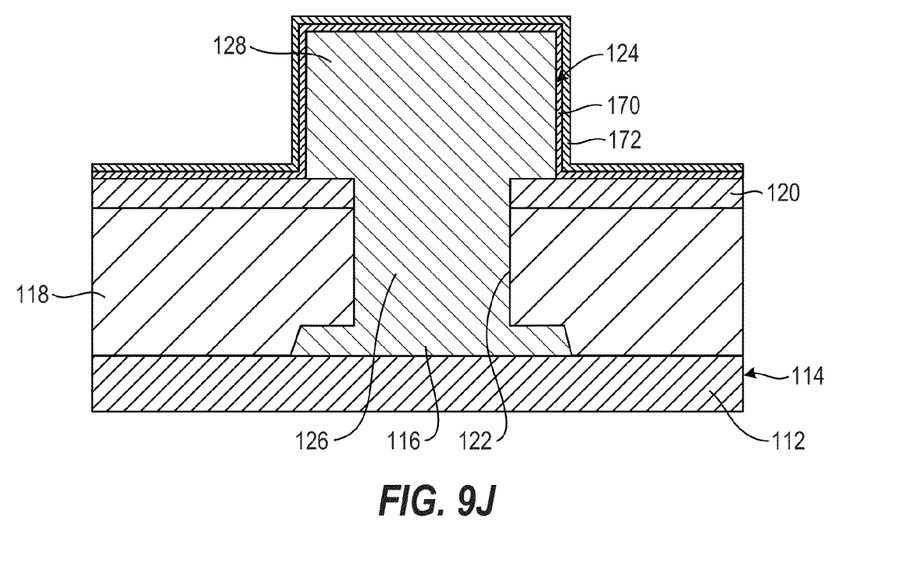

Referring to FIG. 9J, after tensile region 170 has reached its design thickness, the deposition conditions within the deposition chamber are changed to modified deposition conditions that cause the dielectric material of second passivation layer 130 to be deposited subject to compressive stress. The dielectric material deposited on tensile region 170 under the modified deposition conditions forms compressive region 172. Deposition with the modified deposition conditions continues until compressive region 172 reaches its design thickness, whereupon the deposition conditions are restored to the initial deposition conditions once more to deposit the dielectric material of second passivation layer 130 subject to tensile stress to form another tensile region 170 (not shown). Tensile region 170 and compressive region 172 range in thickness from about 10 nm to about 300 nm.

The operations just described with reference to FIGS. 9I and 9J are repeated until the number of region pairs, each composed of a respective tensile region 170 and compressive region 172, deposited is sufficient to subject second passivation layer 130 to the design level of compressive stress. The finished semiconductor device is shown in FIG. 7.

In the example just described, the precursors flow continuously into the PECVD deposition chamber during deposition of second passivation layer 130, and the deposition conditions within the deposition chamber are changed by changing the level of RF power supplied to the deposition chamber. A lower-level of RF power subjects the deposited material to tensile stress, whereas a higher level of RF power subjects the deposited material to compressive stress. Instead of the precursors flowing continuously into the deposition chamber, the flow of the precursors into the deposition chamber may be interrupted after each region has reached its design thickness. Other deposition conditions that may be changed to control the stress to which the deposited dielectric material is subject include the chamber pressure, the electrode spacing, and the precursors flowing into the deposition chamber. Changing the precursors flowing into the deposition chamber forms the regions from different dielectric materials, e.g. regions of $SiO_2$ alternating with regions of $Si_3N_4$. Combinations of the above deposition conditions may be changed.

A process similar to that described above can be used to fabricate semiconductor device 100 described above with reference to FIG. 3A and FIG. 3B. Operations identical to those described above with reference to FIGS. 9A and 9B are performed. The operation described above with reference to FIG. 9C is omitted. An operation similar to that described above with reference to FIG. 9D is performed, but via 122 is etched through ILD layer 118 only. An operation similar to that described above with reference to FIG. 9E is performed, but seed layer 180 is deposited on the surface of ILD layer 118. The portion of seed layer 180 constituting annular portion 182 contacts ILD layer 118 to form seal 142. Operations identical to those described above with reference to FIG. 9F-9J are performed to complete the formation of second metal layer 124. Operations identical to those described above with reference to FIGS. 9I and 9J are performed to form passivation layer 130, and thus complete fabrication of the device shown in FIG. 3A.

Figure 10:
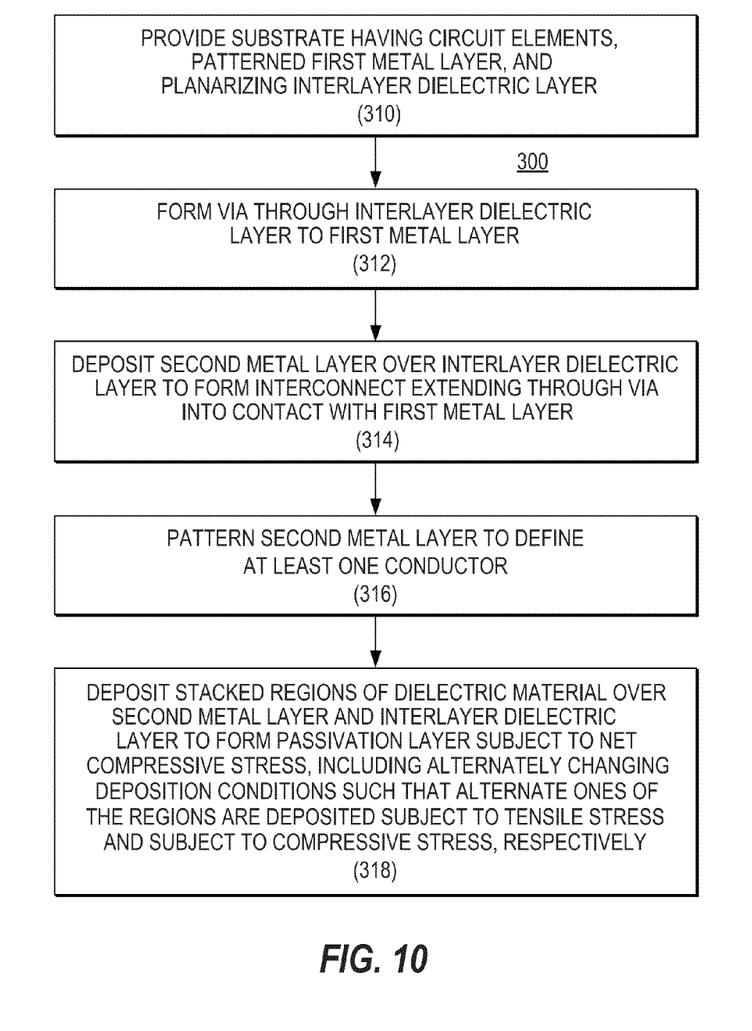
FIG. 10 is a flowchart showing an example of a method that can be used to fabricate the semiconductor device shown in FIG. 3A.

FIG. 10 is a flowchart showing an example 300 of method of making a semiconductor device. In block 310, a substrate is provided. The substrate includes circuit elements, a patterned first metal layer and an interlayer dielectric layer. In block 314, a second metal layer is the posited over the interlayer dielectric layer to form an interconnect extending through the via into contact with the first metal layer. In block 316, the second metal layer is patterned to define at least one conductor. In block 318, stacked regions of dielectric material are deposited over the second metal layer and the interlayer dielectric layer to form a passivation layer subject to net compressive stress. Depositing the stacked regions of dielectric material includes alternately changing deposition conditions to subject alternate ones of the regions to tensile stress and compressive stress, respectively.

Figure 11:
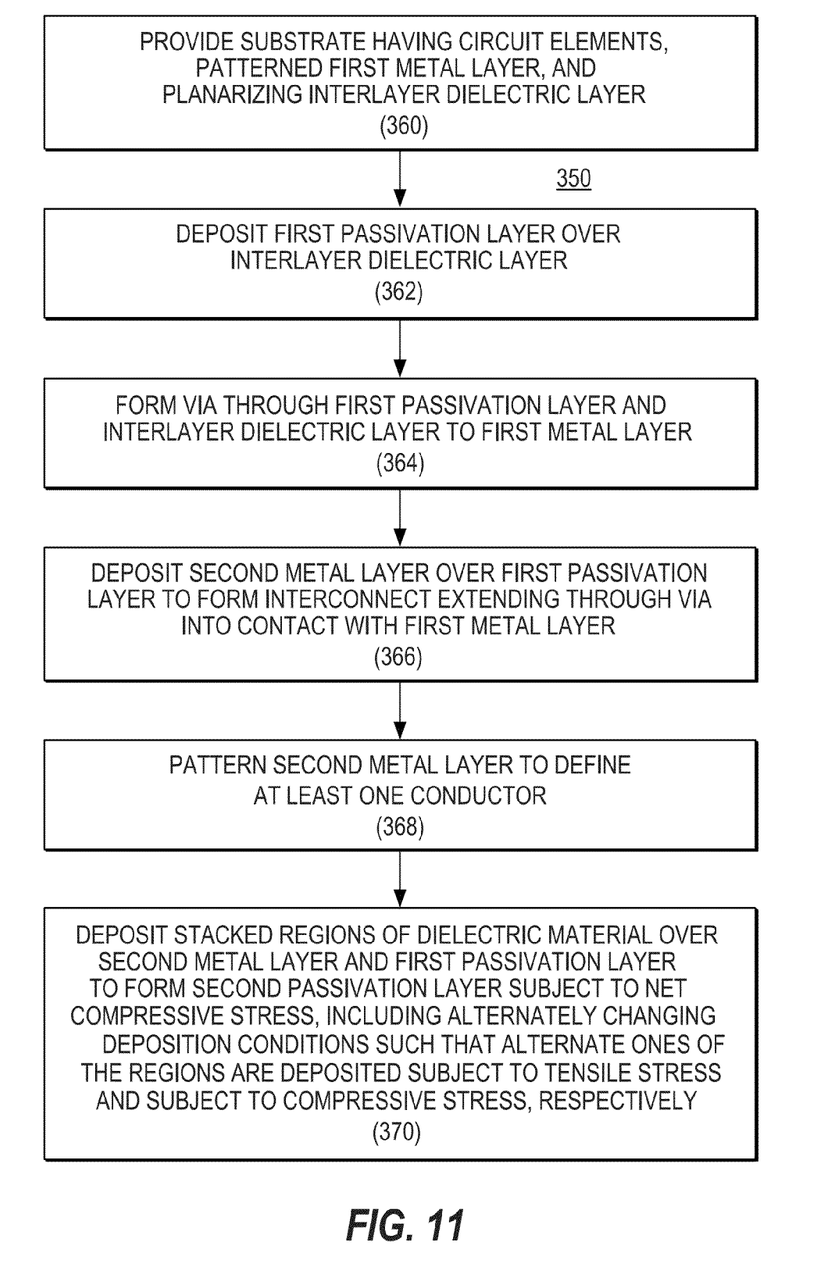
FIG. 11 is a flowchart showing an example of a method that can be used to fabricate the semiconductor device shown in FIG. 7.

FIG. 11 is a flowchart showing an example 350 of a method of making a semiconductor device. In block 360, a substrate is provided. The substrate includes circuit elements, a patterned first metal layer and an interlayer dielectric layer. In block 362, a first passivation layer is deposited over the interlayer dielectric layer. In block 364, a via is formed through the first passivation layer and the interlayer dielectric layer to the first metal layer. In block 366, a second metal layer is deposited over the first passivation layer to form an interconnect extending through the via into contact with the first metal layer. In block 368, the second metal layer is patterned to define at least one conductor. In block 370, stacked regions of dielectric material are deposited over the second metal layer and the first passivation layer to form a passivation layer subject to net compressive stress. Depositing the stacked regions of dielectric material includes alternately changing deposition conditions to subject alternate ones of the regions to tensile stress and compressive stress, respectively.

In the fabrication process described above with reference to FIGS. 9A-9J, the deposition conditions are alternately changed as described above with reference to block 318 of method 300 and to block 370 of method 350. Other deposition conditions that may be changed include temperature, and the precursors used to form the dielectric material of the passivation layer or second passivation layer.

In some embodiments of methods 300, 350, in blocks 316, 368, respectively, the second metal layer is patterned in stages. For example, in the fabrication method described above with reference to FIGS. 9A-9J, the seed layer of the second metal layer is deposited, the plated layer of the second metal layer is patterned as it is deposited on the seed layer, and seed layer is then patterned.

This disclosure describes the invention in detail using illustrative embodiments. However, the invention defined by the appended claims is not limited to the precise embodiments described.

We claim:

1. A semiconductor device, comprising: a Group III-V semiconductor substrate; a first metal layer over the substrate; a planarizing interlayer dielectric layer over the first metal layer, the interlayer dielectric layer defining a via extending therethrough to the first metal layer; a second metal layer, greater in thickness than the first metal layer, over the interlayer dielectric layer the second metal layer comprising an interconnect extending through the via into contact with the first metal layer, the second metal layer patterned to define at least one conductor; and a passivation layer over the second metal layer and the interlayer dielectric layer, the passivation layer comprising stacked regions of dielectric material, ones of regions under tensile stress alternating with ones of the regions under compressive stress, such that the passivation layer is subject to net compressive stress.

2. The semiconductor device of claim 1, in which:
the passivation layer is a second passivation layer;
the semiconductor device additionally comprises a first passivation layer between the interlayer dielectric layer and the second metal layer; and
the interconnect additionally extends through the first passivation layer.

3. The semiconductor device of claim 2, in which the second metal layer is on the first passivation layer.

4. The semiconductor device of claim 2, in which, at the interconnect, the second metal layer extends laterally over the first passivation layer, and contacts the first passivation layer to form a seal that encloses the via.

5. The semiconductor device of claim 2, in which the second metal layer comprises an annular portion extending laterally over the first passivation layer around the via, the annular portion contacting the first passivation layer to form a seal that encloses the via.

6. The semiconductor device of claim 2, in which the regions constituting the second passivation layer continuously cover corners between the first passivation layer and the second metal layer.

7. The semiconductor device of claim 2, in which the second passivation layer comprises plasma-deposited silicon nitride, silicon dioxide, or silicon oxynitride.

8. The semiconductor device of claim 2, in which the ones of the regions under tensile stress differ in thickness from the ones of the regions under compressive stress.

9. The semiconductor device of claim 1, in which the second metal layer comprises plated gold.

10. The semiconductor device of claim 1, in which the second metal layer comprises an annular portion extending across the interlayer dielectric layer around the via, the annular portion contacting the interlayer dielectric layer to form a seal that encloses the via.

11. The semiconductor device of claim 1, in which the regions constituting the passivation layer continuously cover corners between the interlayer dielectric layer and the second metal layer.

12. The semiconductor device of claim 1, in which the ones of the regions under tensile stress differ in thickness from the ones of the regions under compressive stress.

13. The semiconductor device of claim 1, in which the interlayer dielectric layer comprises a polymer.

14. A semiconductor device, comprising: a Group III-V semiconductor substrate; a first metal layer over the substrate; a planarizing interlayer dielectric layer over the first metal layer; a first passivation layer over the interlayer dielectric layer, the first passivation layer and the interlayer dielectric layer defining a via extending therethrough to the first metal layer; a second metal layer, greater in thickness than the first metal layer, on the first passivation layer, the second metal layer comprising an interconnect extending through the via into contact with the first metal layer, the second metal layer patterned to define at least one conductor; and a second passivation layer over the second metal layer and the first passivation layer, the second passivation layer comprising stacked regions of dielectric material, ones of regions under tensile stress alternating with ones of the regions under compressive stress, such that the second passivation layer is subject to net compressive stress.

15. The semiconductor device of claim 14, in which the second metal layer comprises an annular portion extending laterally across the first passivation layer around the via, the annular portion contacting the first passivation layer to form a seal that encloses the via.

16. The semiconductor device of claim 14, in which the regions constituting the second passivation layer continuously cover corners between the first passivation layer and the second metal layer.

17. The semiconductor device of claim 14, in which the second passivation layer comprises plasma-deposited silicon nitride, silicon dioxide, or silicon oxynitride.

18. The semiconductor device of claim 14, in which the ones of the regions under tensile stress differ in thickness from the ones of the regions under compressive stress.

19. The semiconductor device of claim 14, in which the second metal layer comprises plated gold.

* * * * *